United States Patent
Li

(10) Patent No.: US 9,632,377 B2
(45) Date of Patent: Apr. 25, 2017

(54) ARRAY SUBSTRATE AND METHOD OF REPAIRING BROKEN LINES THEREFOR

(71) Applicant: Shenzhen China Star Optoelectronics Technology Co., Ltd., Shenzhen (CN)

(72) Inventor: Shan Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/758,807

(22) PCT Filed: Apr. 1, 2015

(86) PCT No.: PCT/CN2015/075677
§ 371 (c)(1),
(2) Date: Jul. 1, 2015

(87) PCT Pub. No.: WO2016/127480
PCT Pub. Date: Aug. 18, 2016

(65) Prior Publication Data
US 2016/0313619 A1  Oct. 27, 2016

(30) Foreign Application Priority Data

Feb. 12, 2015  (CN) .......................... 2015 1 0073541

(51) Int. Cl.
*H01L 27/12* (2006.01)
*G02F 1/1362* (2006.01)

(52) U.S. Cl.
CPC ...... *G02F 1/136259* (2013.01); *G02F 1/1362* (2013.01); *G02F 1/136286* (2013.01); *H01L 27/124* (2013.01); *H01L 27/1248* (2013.01); *G02F 2001/136263* (2013.01); *G02F 2001/136295* (2013.01)

(58) Field of Classification Search
CPC .......................... H01L 27/124; H01L 27/1251
See application file for complete search history.

(56) References Cited

U.S. PATENT DOCUMENTS

2006/0094241 A1* 5/2006 Park .......................... C23F 1/20
                                                          438/689
2015/0362811 A1* 12/2015 Huang ................ H01L 27/1225
                                                          438/104

\* cited by examiner

*Primary Examiner* — Thanh V Pham
(74) *Attorney, Agent, or Firm* — Leong C. Lei

(57) ABSTRACT

The present invention provides an array substrate and method of repairing broken lines therefor, by forming a via on the organic layer corresponding to each intersection of the gate scan lines and the source-drain data lines, and deposing the second passivation layer in the via to form an aperture, with the vias, a U shape long line can be directly laser welded between the apertures at two ends of a broken line position to recover a connection of the broken gate scan line or the source-drain data line as the gate scan line or the source-drain data line on the substrate of the present invention is broken. The method of repairing saves the process of removing the organic layer with laser and effectively reduces the machine laser loss as removing the organic layer to raise the repair efficiency and the repair success rate. Thus, the display quality of the liquid crystal panel product is promoted.

12 Claims, 3 Drawing Sheets

ARRAY SUBSTRATE AND METHOD OF REPAIRING BROKEN LINES THEREFOR

FIELD OF THE INVENTION

The present invention relates to a display skill field, and more particularly to an array substrate and a method of repairing broken lines for the array substrate.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions.

Generally, the liquid crystal display panel comprises a CF (Color Filter) substrate, a TFT (Thin Film Transistor) substrate, LC (Liquid Crystal) sandwiched between the CF substrate and TFT substrate and sealant. The formation process generally comprises: a forepart Array process (thin film, photo, etching and stripping), a middle Cell process (Lamination of the TFT substrate and the CF substrate) and a post module assembly process (Attachment of the driving IC and the printed circuit board). The forepart Array process is mainly to form the TFT substrate for controlling the movement of the liquid crystal molecules; the middle Cell process is mainly to add liquid crystal between the TFT substrate and the CF substrate; the post module assembly process is mainly the driving IC attachment and the integration of the printed circuit board. Thus, the liquid crystal molecules are driven to rotate and display pictures.

With the constant development of the liquid crystal panel technology, more and more new technologies have been applied in the thin film transistor array substrate, such as In-Plane Switching (IPS), Fringe Field Switching (FFS), Color Filter On Array (COA) and et cetera. These technologies have higher demands for the flatness of the display substrate and generally, an organic layer, such as a color resist layer, a flat layer, which is thicker is required to be deposed on the array substrate. During the manufacture process of the array substrate, there may be broken line situations happening to the metal lines, including the scan lines and the data lines due to the effects of various reasons. For repairing such broken lines of the array substrate, the laser welding is utilized for repairing the broken line position after the broken line repairer removes the organic layer and the transparent electrode, first. The broken line repair takes a lot of time. When the organic layer cannot be completely removed, it can affect the broken line repair success rate of the product.

SUMMARY OF THE INVENTION

An objective of the present invention is to provide an array substrate, and a plurality of apertures are formed on the surface of the array substrate where correspond to the gate scan lines and source-drain data lines, and the apertures are formed at the via of the organic layer for directly laser welding a U shape long line between the apertures at two ends of a broken line position to raise the repair efficiency and the repair success rate as implementing broken line repair to the array substrate of the present invention.

An objective of the present invention is further to provide a method of repairing broken lines for the array substrate, by directly laser welding a U shape long line between the apertures at two ends of a broken line position to recover a connection of the broken gate scan line or the source-drain data line to save the process of removing the organic layer with laser to raise the repair efficiency and the repair success rate. Meanwhile, the machine laser loss as removing the organic layer can be effectively reduced. Thus, the display quality of the liquid crystal panel product is promoted.

For realizing the aforesaid objectives, the present invention provides an array substrate, comprising: a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;

wherein, the gate scan lines and the source-drain data lines are perpendicularly and crosswise arranged on the substrate, and a via is formed on the organic layer corresponding to each intersection of the gate scan lines and the source-drain data lines, and the second passivation layer is deposed in the via to form an aperture.

A dimension of the aperture is 15 μm×15 μm.

The organic layer is a color resist layer or a flat layer.

Material of the first passivation layer and the second passivation layer is inorganic material.

A thickness of the organic layer is larger than thicknesses of the first passivation layer and the second passivation layer.

The substrate is a glass substrate.

A structure of the array substrate at the aperture comprises the substrate, the gate scan line, the gate isolation layer, the source-drain data line, the first passivation layer and the second passivation layer.

The present invention further provides an array substrate, comprising: a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;

wherein, the gate scan lines and the source-drain data lines are perpendicularly and crosswise arranged on the substrate, and a via is formed on the organic layer corresponding to each intersection of the gate scan lines and the source-drain data lines, and the second passivation layer is deposed in the via to form an aperture;

wherein a dimension of the aperture is 15 μm×15 μm;

wherein the organic layer is a color resist layer or a flat layer.

The present invention further provides a method of repairing broken lines for the array substrate, as the gate scan lines or the source-drain data lines are broken, a connection of the broken gate scan line or the source-drain data line is recovered by laser welding a U shape long line between the apertures at two ends of a broken line position of the gate scan line or the source-drain data line.

Material of the U shape long line is tungsten carbonyl.

A dimension of the aperture is 15 μm×15 μm.

The benefits of the present invention are: the present invention provides an array substrate and method of repairing broken lines therefor, by forming a via on the organic layer corresponding to each intersection of the gate scan lines and the source-drain data lines, and deposing the second passivation layer in the via to form an aperture, a U shape long line can be directly laser welded between the apertures at two ends of a broken line position to recover a connection of the broken gate scan line or the source-drain data line as the gate scan line or the source-drain data line on the substrate of the present invention is broken. The method of repairing saves the process of removing the organic layer with laser and effectively reduces the machine laser loss as removing the organic layer to raise the repair efficiency and the repair success rate. Thus, the display quality of the liquid crystal panel product is promoted.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
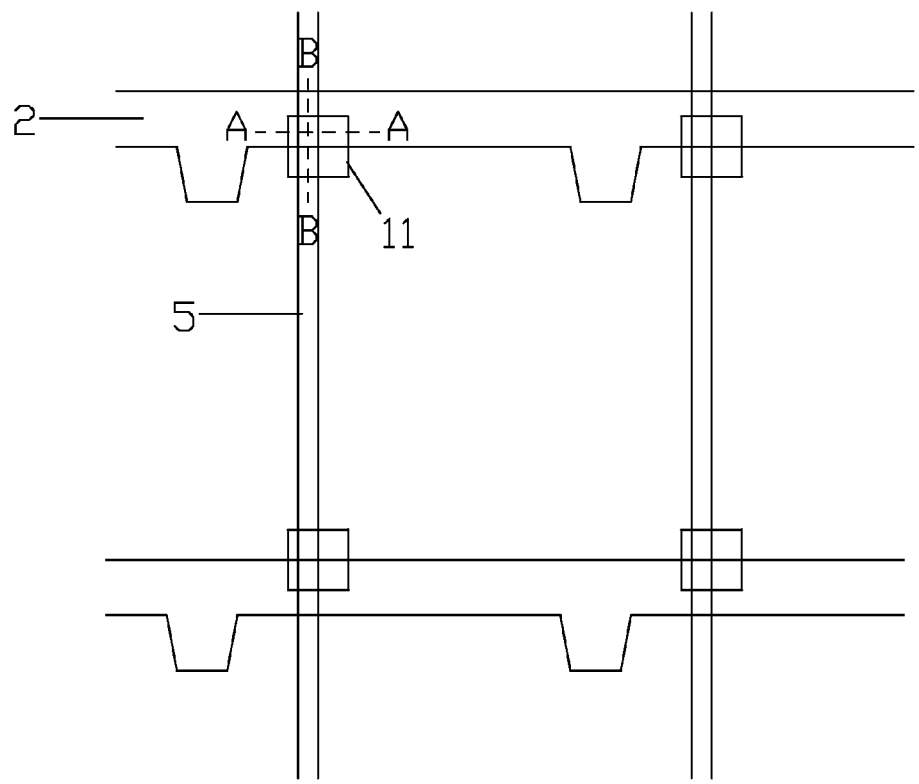
FIG. 1 is a structural diagram of an array substrate according to the present invention.
Figure 2:
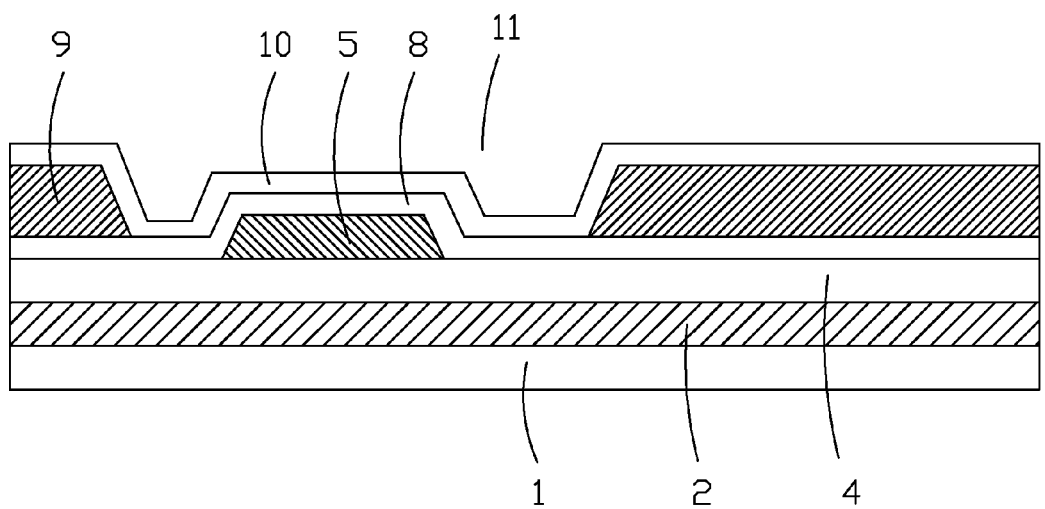
FIG. 2 is a sectional diagram along the A-A line at the aperture of the array substrate shown in FIG. 1.
Figure 3:
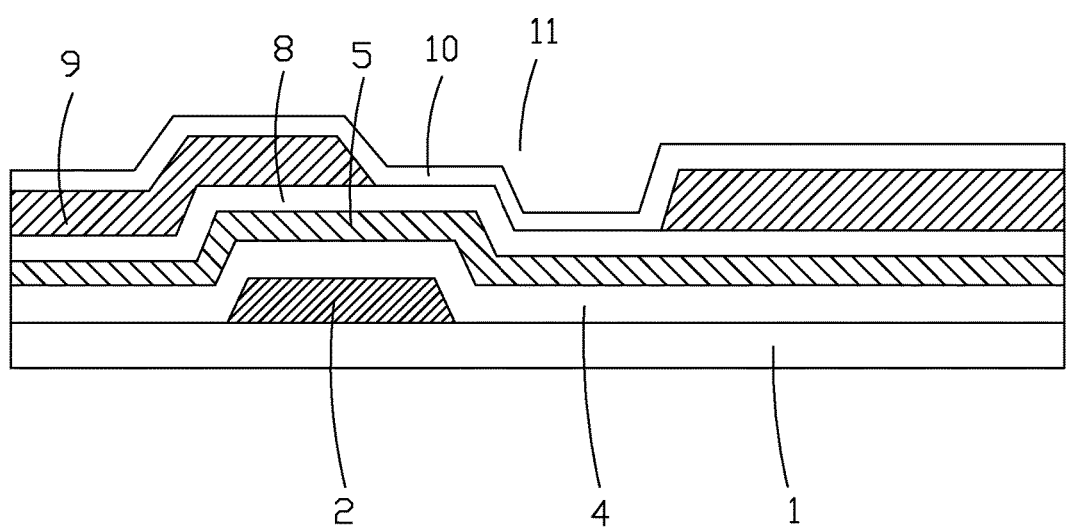
FIG. 3 is a sectional diagram along the B-B line at the aperture of the array substrate shown in FIG. 1.

Please refer to FIG. 1-FIG. 3, which are embodiments of the array substrate according to the present invention. The array substrate comprises: a substrate 1, gate scan lines 2 on the substrate 1, a gate isolation layer 4 on the gate scan lines 2 and the substrate 1, source-drain data lines 5 on the gate isolation layer 4, a first passivation layer 8 on the source-drain data lines 5 and the gate isolation layer 4, an organic layer 9 on the first passivation layer 8 and a second passivation layer 10 on the organic layer 9 and the first passivation layer 8.

Specifically, the organic layer 9 is a color resist layer or a flat layer; material of the first passivation layer 8 and the second passivation layer 10 is inorganic material; a thickness of the organic layer 9 is larger than thicknesses of the first passivation layer 8 and the second passivation layer 10; the substrate 1 is a glass substrate.

Specifically, the gate scan lines 2 and the source-drain data lines 5 are perpendicularly and crosswise arranged on the substrate 1, and a via is formed on the organic layer 9 corresponding to each intersection of the gate scan lines 2 and the source-drain data lines 5, and the second passivation layer 10 is deposed in the via to form an aperture 11, and as shown in FIG. 2 and FIG. 3, a structure of the array substrate at the aperture 11 comprises the substrate 1, the gate scan line 2, the gate isolation layer 4, the source-drain data line 5, the first passivation layer 8 and the second passivation layer 10.

Preferably, a dimension of the aperture 11 is 15 μm×15 μm.

The array substrate provided by the present invention, by forming apertures 11 on the second passivation layer 10 corresponding to intersections of the gate scan lines 2 and the source-drain data lines 5 to be preserved as being the broken line repairing points for the gate scan lines 2 and the source-drain data lines 5. With the apertures 11, the broken lines can be repaired by laser welding U shape long line 15.

Figure 4:
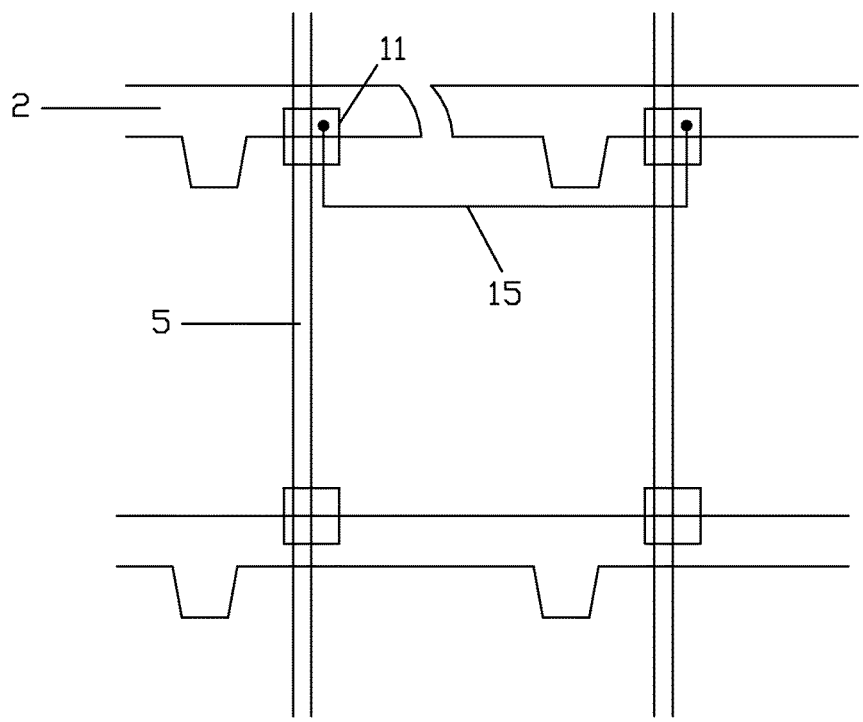
FIG. 4 is a diagram of repairing the broken gate scan line for the array substrate shown in FIG. 1 by utilizing the method of laser welding U shape long line.
Figure 5:
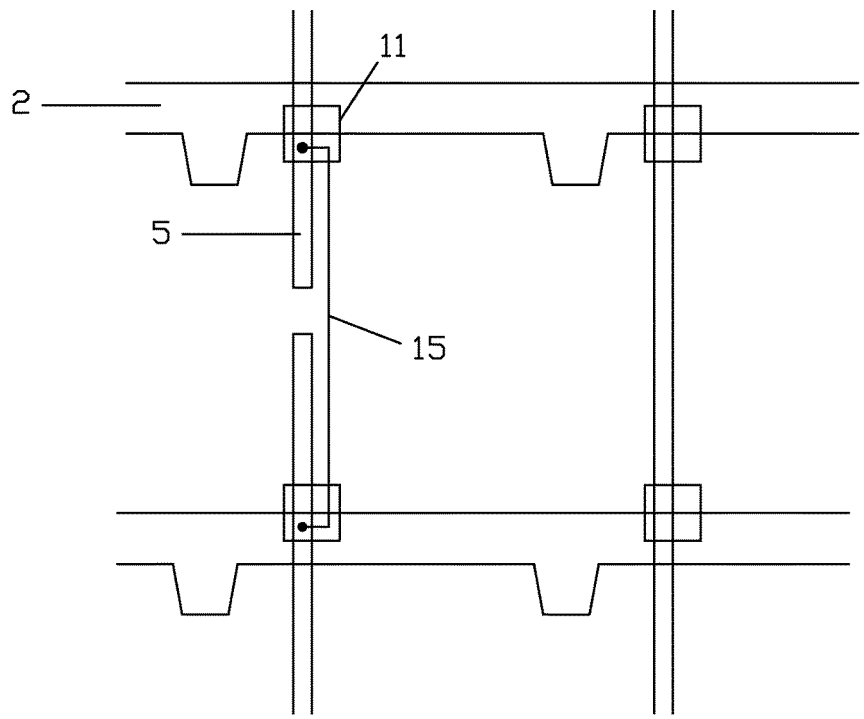
FIG. 5 is a diagram of repairing the broken source-drain data line for the array substrate shown in FIG. 1 by utilizing the method of laser welding U shape long line.

On the basis of the aforesaid array substrate structure, as shown in FIG. 4, FIG. 5, the method of repairing the broken lines for the array substrate of the present invention by utilizing the method of laser welding U shape long line comprises:

AS shown in FIG. 1 and FIG. 4, as the gate scan line 2 on the array substrate is broken due to the deficient process, by laser welding a U shape long line 15 between the apertures 11 on the gate scan line 2 at two ends of a broken line position, the connection of the broken gate scan line 2 can be recovered.

As shown in FIG. 1 and FIG. 5, as the source-drain data lines 5 on the array substrate is broken due to the deficient process, by laser welding a U shape long line 15 between the apertures 11 on the source-drain data lines 5 at two ends of a broken line position, the connection of the broken source-drain data lines 5 can be recovered.

Preferably, material of the U shape long line 15 utilized in the aforesaid method of repairing the broken lines for the array substrate is tungsten carbonyl.

In the method of repairing the broken lines for the array substrate shown in FIG. 4, FIG. 5, no organic layer 9 is formed in the aperture 11 above the gate scan line 2 or the source-drain data lines 5 of the array substrate, thus, the process of removing the organic layer 9 with laser is eliminated. By directly laser welding the U shape long line 15 between the apertures 11 at two ends of the broken line position, the broken line repairing to the gate scan line 2 or the source-drain data lines 5 can be accomplished to effectively reduce the machine laser loss as removing the organic layer and raise the repair efficiency and the repair success rate. Thus, the display quality of the liquid crystal panel product is promoted.

In conclusion, the present invention provides an array substrate and method of repairing broken lines therefor, by forming a via on the organic layer corresponding to each intersection of the gate scan lines and the source-drain data lines, and deposing the second passivation layer in the via to form an aperture, a U shape long line can be directly laser welded between the apertures at two ends of a broken line position to recover a connection of the broken gate scan line or the source-drain data line as the gate scan line or the source-drain data line on the substrate of the present invention is broken. The method of repairing saves the process of removing the organic layer with laser and effectively reduces the machine laser loss as removing the organic layer to raise the repair efficiency and the repair success rate. Thus, the display quality of the liquid crystal panel product is promoted.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An array substrate, comprising: a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;
wherein, the gate scan lines and the source-drain data lines are perpendicularly and crosswise arranged on the substrate, and a via is formed in the organic layer corresponding to each intersection of the gate scan lines and the source-drain data lines, and the second passivation layer is deposed in the via to form an aperture.

2. The array substrate according to claim 1, wherein a dimension of the aperture is 15 μm×15 μm.

3. The array substrate according to claim 1, wherein the organic layer is a color resist layer or a flat layer.

4. The array substrate according to claim 1, wherein material of the first passivation layer and the second passivation layer is inorganic material.

5. The array substrate according to claim 1, wherein a thickness of the organic layer is larger than thicknesses of the first passivation layer and the second passivation layer.

6. The array substrate according to claim 1, wherein the substrate is a glass substrate.

7. The array substrate according to claim 1, wherein a structure of the array substrate at the aperture comprises the substrate, the gate scan line, the gate isolation layer, the source-drain data line, the first passivation layer and the second passivation layer.

8. An array substrate, comprising: a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;
wherein, the gate scan lines and the source-drain data lines are perpendicularly and crosswise arranged on the substrate, and a via is formed in the organic layer corresponding to each intersection of the gate scan lines and the source-drain data lines, and the second passivation layer is deposed in the via to form an aperture;
wherein a dimension of the aperture is 15 μm×15 μm;
wherein the organic layer is a color resist layer or a flat layer.

9. The array substrate according to claim 8, wherein material of the first passivation layer and the second passivation layer is inorganic material.

10. The array substrate according to claim 8, wherein a thickness of the organic layer is larger than thicknesses of the first passivation layer and the second passivation layer.

11. The array substrate according to claim 8, wherein the substrate is a glass substrate.

12. The array substrate according to claim 8, wherein a structure of the array substrate at the aperture comprises the substrate, the gate scan line, the gate isolation layer, the source-drain data line, the first passivation layer and the second passivation layer.

* * * * *